(12) United States Patent
Suzuki

(10) Patent No.: US 6,763,585 B2
(45) Date of Patent: Jul. 20, 2004

(54) METHOD FOR PRODUCING MICRO BUMP

(75) Inventor: Shinichi Suzuki, Tsurugashima (JP)

(73) Assignees: Pioneer Corporation, Tokyo (JP); Pioneer FA Corporation, Saitama (JP)

( * ) Notice: Subject to any disclaimer, the term of this patent is extended or adjusted under 35 U.S.C. 154(b) by 0 days.

(21) Appl. No.: 10/013,716

(22) Filed: Dec. 13, 2001

(65) Prior Publication Data

US 2002/0076912 A1 Jun. 20, 2002

(30) Foreign Application Priority Data

Dec. 15, 2000 (JP) .................................. P2000-381803

(51) Int. Cl.$^7$ ............................................. H01R 43/02
(52) U.S. Cl. ........................ 29/877; 29/878; 436/613; 436/106; 436/107; 436/110; 436/113; 436/460; 257/E21.508
(58) Field of Search ................... 29/877, 878; 438/613, 438/106, 107, 110, 113, 460; 257/E21.508

(56) References Cited

U.S. PATENT DOCUMENTS 5,672,542 A  *  9/1997  Schwiebert et al. ........... 438/4
5,880,017 A  *  3/1999  Schwiebert et al. ........ 438/613
6,074,893 A  *  6/2000  Nakata et al. .............. 438/106

\* cited by examiner

*Primary Examiner*—Carl J. Arbes
*Assistant Examiner*—Tim Phan
(74) *Attorney, Agent, or Firm*—Nixon & Vanderhye, PC

(57) ABSTRACT

A resist pattern in accordance with a predetermined pattern is formed on a substrate. Next, a bump resist mixed with a micro metallic powder is made thicker than the resist pattern and formed on the substrate formed with the resist pattern. Continuously, the bump resist on the resist pattern is removed in the bump resist. Next, the resist pattern is removed. As a result, a bump resist pattern corresponding to the predetermined pattern remains on the substrate. Furthermore, the resist component in this bump resist pattern is removed, thereby forming a micro bump (micro projecting electrode) 8 consisting of the micro metallic powder on the substrate.

6 Claims, 5 Drawing Sheets

METHOD FOR PRODUCING MICRO BUMP

CROSS REFERENCE TO RELATED DOCUMENT

The present application claims the benefit of Japanese Patent Application No. P2000-381803, filed Dec. 15, 2000.

BACKGROUND OF THE INVENTION

1. Field of the Invention

The present invention belongs to the technical field of a method for producing a micro bump on a circuit board of an integrated circuit chip, glass, crystal or the like.

2. Description of the Related Art

Conventionally, in the case where an integrated circuit chip is mounted on an integrated circuit board, or in the case where an integrated circuit board is mounted on a circuit board, furthermore in the case where an integrated circuit chip is directly mounted on a circuit board, various chip mounting technologies are used.

For example, an ACF (Anisotropic Conductive Film) method for connecting an integrated circuit chip to a circuit board by an anisotropic conductive bonding, or an SBB (Stud Bump Bonding) method for bonding an integrated circuit chip and a circuit board with a conductive paste, otherwise a method such as a plating method for obtaining a bump by forming and phasing a plated layer using a resist on an electrode, is used.

However, according to the aforesaid conventional method, after the integrated circuit chip is produced, since it is necessary to form bumps on the respective individual integrated circuit chips, it is difficult to form bumps with good accuracy, and in the case especially where the number of pins of the integrated circuit chip or the integrated circuit board is increased, it is difficult to carry out mounting with a good yield.

Furthermore, in the conventional method, since the bump is formed after being cut into individual chips, in the case where the same processing is carried out for a large quantity of chip, it takes a long time.

Moreover, in the conventional method, for example, a coating step of sealant in an SBB (Stud Bump Bonding) method or a GBS method, or a substrate washing step in an ACF (Anisotropic Conductive Film) method and a temporary crimping step and the like of ACF are necessary, thus posing a problem in that the man-hour in the mounting step is increased.

SUMMARY OF THE INVENTION

Therefore, an object of the present invention is to provide a method capable of solving such problems, and producing the micro bump in a short time with high accuracy even in the case where the number of pins of the integrated circuit chip or the integrated circuit board is increased.

The above object of the present invention can be achieved by a method of the present invention for producing a micro bump is provided with: a step of forming a resist of a predetermined pattern on a substrate; a step of forming a bump resist mixed with micro metallic powder on the substrate on which the resist is formed; a step of removing the resist; and a step of removing a resist component in the bump resist, whereby forming the micro bump comprising the micro metallic powder on the substrate.

According to the present invention, a resist in accordance with a predetermined pattern is first formed on a substrate. Next, on the substrate formed with the resist, a bump resist mixed with micro metallic powder is formed. Continuously, the resist is removed. As a result, on the substrate, there remains the bump resist corresponding to the predetermined pattern. Furthermore, by removing a resist component in this bump resist, on the substrate, there is formed the micro bump consisting of the micro metallic powder.

As described above, according to the present invention, since the micro bump is formed by the photo etching technology using the bump resist containing the micro metallic powder, patterning of very high accuracy is possible as compared to the conventional method. Further, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board. Furthermore, by using the bump resist containing the micro metallic powder, it is possible to form the micro bump of minute width simply by forming a resist pattern of a desired width. Furthermore, since the photo etching technology is used, it is possible to incorporate into a semiconductor process to produce the integrated circuit chip or the integrated circuit board, making it is possible to form the necessary number of micro bumps on a large wafer at one time, so that it is possible to carry out a processing for a large quantity of the integrated circuit chip or the integrated circuit board in a short time. Moreover, since it is possible to sufficiently increase the thickness of the micro bump, connection with a lead can be ensured.

The above object of the present invention can be achieved by a method of the present invention for producing the micro bump is provided with: a step of forming a resist of a predetermined pattern on the substrate; a step of forming a bump resist mixed with micro metallic powder being made thicker than the resist on the substrate on which the resist is formed; a step of removing the resist; and a step of removing a resist component in the bump resist, whereby forming the micro bump comprising the micro metallic powder on the substrate.

According to the present invention, a resist in accordance with a predetermined pattern is first formed on a substrate. Next, on the substrate formed with the resist, the bump resist mixed with the micro metallic powder is formed with a thickness greater than that of the resist. Continuously, the bump resist of the bump resist formed on the resist is removed. As a result, the bump resist corresponding to the predetermined pattern remains on the substrate. Therefore, by removing the resist component in this bump resist, the micro bump consisting of the micro metallic powder is formed on the substrate.

As described above, according to the present invention, since the micro bump is formed by the photo etching technology using the bump resist containing the micro metallic powder, patterning of very high accuracy is possible as compared to the conventional method. Further, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board. Furthermore, by using the bump resist containing the micro metallic powder, it is possible to easily form the micro bump of minute width simply by forming the resist pattern of a desired width. Furthermore, since the photo etching technology is used, it is possible to incorporate into a semiconductor process to produce the integrated circuit chip or the integrated circuit board, making it possible to form the necessary number of the micro bump on a large wafer at one time, it is possible to carry out a processing for a large quantity of the integrated circuit chip or the integrated circuit board in a short time. Moreover, since it is possible to sufficiently increase the thickness of the fine bumps, connection with a lead can be ensured.

The above object of the present invention can be achieved by a method of the present invention for producing the micro bump is provided with: a step of forming a resist of a predetermined pattern on the substrate; a step of forming a bump resist mixed with the micro metallic powder on the substrate having on which the resist is formed; a step of removing the resist and a bump resist formed on the resist out of the bump resist; and a step of removing a resist component in the bump resist, whereby forming the micro bump comprising the micro metallic powder on the substrate.

According to the present invention, a resist in accordance with a predetermined pattern is first formed on a substrate. Next, on the substrate formed with the resist, the bump resist mixed with the micro metallic powder is formed. Continuously, the bump resist on the resist together with the resist are removed. As a result, the bump resist corresponding to the predetermined pattern remains on the substrate. Therefore, by removing the resist component in this bump resist, the micro bump consisting of the micro metallic powder is formed.

As described above, according to the present invention, since the micro bump is formed by the photo etching technology using the bump resist containing the micro metallic powder, patterning of very high accuracy is possible as compared to the conventional method. Further, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board. Furthermore, since the bump resist containing the micro metallic powder is used, it is possible to easily form the micro bump of minute width simply by forming the resist pattern of a desired width. Furthermore, since the photo etching technology is used, it is possible to incorporate into a semiconductor process to produce the integrated circuit chip or the integrated circuit board, making it possible to form the necessary number of micro bump on a large wafer at one time, it is possible to carry out a processing for a large quantity of the integrated circuit chip or the integrated circuit board. Moreover, since the thickness of the micro bump can be sufficiently increased, joining to a lead can be ensured.

In one aspect of the present invention, the micro metallic powder is joined to form the micro bump.

According to this aspect, since the micro bump is formed with the micro metallic powder being joined, by pressurizing/heating or pressurizing/ultrasonic bonding, it is possible to electrically connect the micro bump with the electrode of the integrated circuit board or the electrode of the circuit board, and the man-hour in the chip mounting step can be reduced as compared to the conventional method.

In another aspect of the present invention, the method is further provided with a step of electrically connecting the micro bump and a lead to the micro bump by bonding the lead with pressurized heat treatment or pressurized ultrasonic bonding.

According to this aspect, since the micro bump is electrically connected with a lead by heat treatment under pressure or ultrasonic bonding under pressure, it is possible to reduce the man-hour in the chip mounting step as compared to the conventional method.

In further aspect of the present invention, wherein a step of selectively forming a resist on the substrate on which the micro bump is formed so as to cover at least a part of the micro bump; a step of forming a bump resist mixed with the micro metallic powder on the substrate; a step of removing a bump resist formed on the resist out of the bump resist; a step of removing the resist; and a step of removing the resist component in the bump resist, whereby forming the micro bump comprising the micro metallic powder on the substrate.

According to this aspect, on the substrate formed with the micro bump by the above-mentioned method, a resist is selectively formed so as to cover at least a part of the micro bump. Next, on the substrate formed with the resist, the bump resist mixed with the micro metallic powder is formed. Next, the bump resist formed on the resist in the bump resist is removed. Next, the resist is removed. As a result, the bump resist corresponding to the predetermined pattern remains on the substrate. Therefore, by removing the resist component in this bump resist, the micro bump of different thickness is overlapped and formed on the substrate. According to the present invention as described above, it is possible to easily produce the micro bump of any form.

DESCRIPTION OF THE PREFERRED EMBODIMENTS

Next, preferred embodiments of the present invention will be described in reference to the accompanying drawings.
[First Embodiment]

First, a first embodiment of the present invention will be explained based on FIG. 1.

FIGS. 1A–1H are drawings to explain the method for producing the micro bump in the first embodiment of the present invention. The method for producing the micro bump in this embodiment will be explained in reference to FIGS. 1A–1H.

Figure 1A:
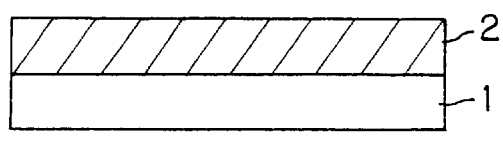
FIG. 1A is a process chart showing an application step of a resist in a production method of a micro bump in the first embodiment of the present invention.

First, as shown in FIG. 1A, a negative type resist 2 is applied to a substrate 1 such as a silicon substrate or a crystal substrate and heated (pre-baked) at approximately 80° C., thereby to remove solvent or moisture from the resist 2.

Figure 1B:
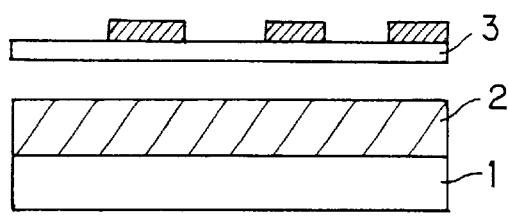
FIG. 1B is a process chart showing an exposure step using a photo mask in the production method.

Next, as shown in FIG. 1B, selective exposure is carried out with a photo mask 3. As a result, the resist 2 is bridged by a bridging action in an exposed portion and becomes the resist 2 which is insoluble to the developing solution.

Figure 1C:
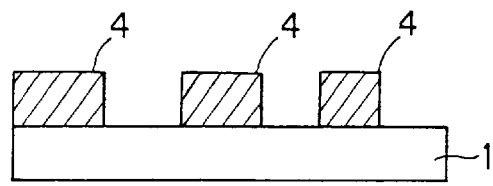
FIG. 1C is a process chart showing a developing step of the resist in the production method.

Therefore, if developing is carried out using a predetermined developing solution, the exposed portion remains without being dissolved, and the unexposed portion is dissolved, so that a resist pattern 4 such as the one shown in FIG. 1C is formed, and a concave portion corresponding to a wiring and a bump pattern 2 is formed.

Figure 1D:
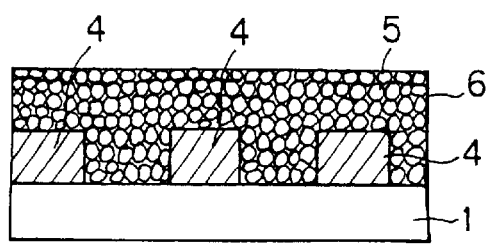
FIG. 1D is a process chart showing an application step of a bump resist mixed with micro metallic powder in the production method.

Next, as shown in FIG. 1D, a positive type bump resist 6 mixed with gold, silver, lead and the like of approximately 0.1 to 5 $\mu$m in grain size and a micro metallic powder 5 such as a mixture thereof is applied, and heated (pre-baked) at approximately 100° C.

Figure 1E:
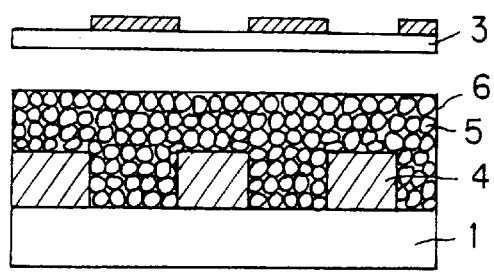
FIG. 1E is a process chart showing an exposure step using the photo mask of the bump resist in the production method.

Furthermore, a mask 3 is used to carry out the selective exposure as shown in FIG. 1E. As a result, the side chain of the bump resist 6 is cut and is dissolved to the developing solution.

Figure 1F:
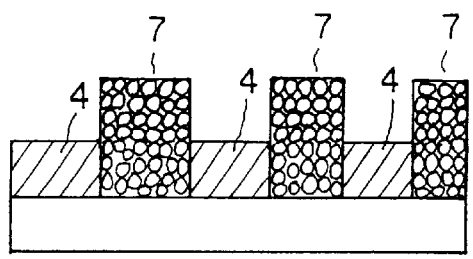
FIG. 1F is a process chart showing a removing step of the bump resist in the production method.

By developing using the predetermined developing solution as described above, only the bump resist 6 is developed and a bump resist pattern 7 is formed as shown in FIG. 1F.

Figure 1G:
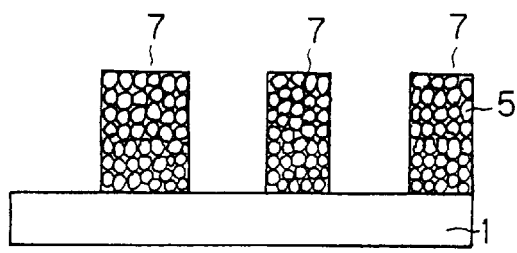
FIG. 1G is a process chart showing a removing step of the resist in the production method.

Furthermore, by removing the resist pattern 4 with an organic type resist releasing solution, the bump resist pattern 7 mixed with the micro metallic powder 5 is formed, as shown in FIG. 1G.

Figure 1H:
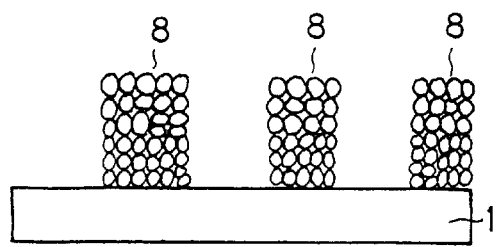
FIG. 1H is a process chart showing the removing step of the resist component in the bump resist in the production method.

Next, as shown in FIG. 1H, by heating at approximately 150° C. or more to remove a resist component in the resist pattern 7 mixed with the micro metallic powder 5, a micro bump (projecting electrode) 8 consisting of the micro metallic powder 5 is formed. Furthermore, the resist 2 of negative type and the bump resist 6 of positive type are used in this embodiment, but the resist 2 may be of the positive type and the bump resist 6 may be of the negative type.

In a manner as described above, according to this embodiment, since the micro bump 8 is formed by the photo etching technology using a resist containing the micro metallic powder 5, as compared to the SBB (Stud Bump Bonding) method, MBB (Micro Bump Bonding) method, GSB (Gold Bump Soldering) method, or the conventional method for forming a solder bump or a gold bump by a plating method, patterning of very high accuracy is possible. Further, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board. Furthermore, the micro bump 8 can be formed with a sufficient thickness, and in a step where heating a lead under pressure or ultrasonic bonding for a lead under pressure is carried out, or in a step where solder fusing for electrically connecting the micro bump 8 and a lead, it is possible to securely bond the micro bump 8 to a lead carried out in a succeeding step.

Furthermore, by using the resist containing the micro metallic powder, it is possible to easily form the micro bump of minute width simply by forming the resist pattern of a desired width.

Furthermore, in the method for producing the micro bump of this embodiment, since the photo etching technology is used, it is possible to incorporate into a semiconductor process to produce the integrated circuit chip or the integrated circuit board. In this embodiment, instead of forming an electrode only after cutting into individual chips as in the case of the conventional bump forming method, it is possible to form the necessary number of micro bumps on a large wafer at one time. Therefore, it is possible to carry out a processing for a large quantity of the integrated circuit chip or the integrated circuit board in a short time.

Furthermore, according to this embodiment, since the micro bump is constituted of the micro metallic powder, without providing an application step of a sealing agent in the SBB (Stud Bump Bonding) method or the GBS method, or a substrate washing step in the ACF (Anisotropic Conductive Film) method and a temporary crimping step of the ACF, by heating under pressure or ultrasonic bonding under pressure, it is possible to electrically connect the micro bump and the electrode of the integrated circuit board or the electrode of the circuit board. In short, according to this embodiment, the man-hour in the chip mounting step can be considerably reduced as compared with the conventional method.

[Second Embodiment]

Next, the second embodiment of the present invention will be explained based on FIGS. 2A–2F. This embodiment explains the case where the micro bump of the present invention is formed by the Liftoff method.

Figure 2A:
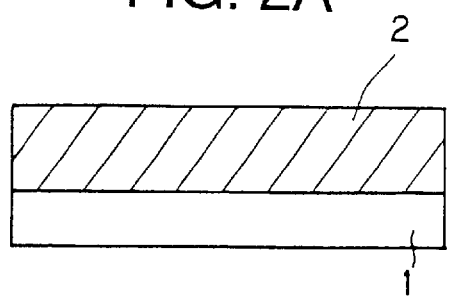
FIG. 2A is a process chart showing an application step of a resist in a production method of a micro bump in the second embodiment of the present invention.

First, as shown in FIG. 2A, the resist 2 of the positive type is applied on the substrate 1 such as a silicon substrate or a crystal substrate, and heated (pre-baked) at approximately 80° C., thereby to remove solvent or moisture from the resist 2.

Figure 2B:
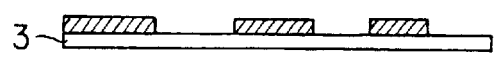
FIG. 2B is a process chart showing an exposure step using a photo mask in the production method.
Figure 2B:
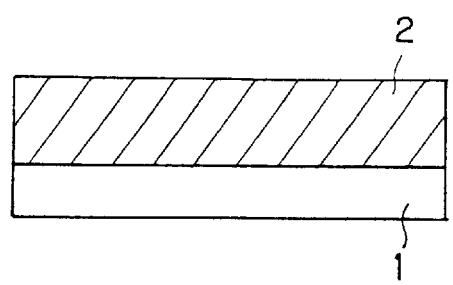

Next, as shown in FIG. 2B, selective exposure is carried out by the photo mask 3. As a result, the resist 2 becomes insoluble to the developing liquid in the unexposed portion.

Figure 2C:
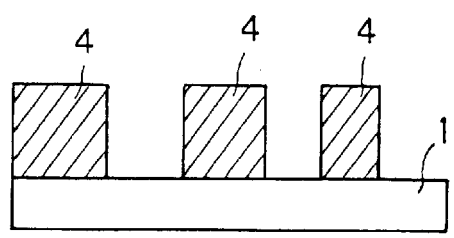
FIG. 2C is a process chart showing a developing step of the resist in the production method.

Therefore, in this state, if developing is carried out using the predetermined developing liquid, the unexposed portion remains without being dissolved, and the exposed portion is dissolved, the resist pattern 4 is formed as shown in FIG. 2C, so that a concave portion corresponding to a wiring and a bump pattern will be formed.

Figure 2D:
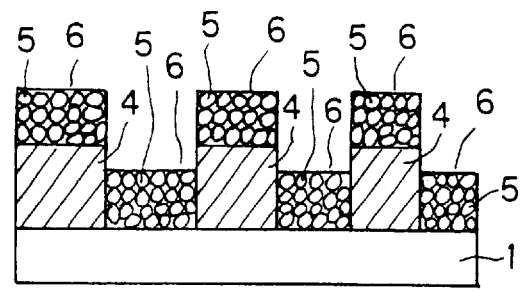
FIG. 2D is a process chart showing an application step of a bump resist mixed with micro metallic powder in the production method.

Next, as shown in FIG. 2D, the positive type bump resist 6 mixed with gold, silver, lead and the like of approximately 0.1 to 5 µm in grain size and the micro metallic powder 5 such as a mixture thereof is applied, and heated (pre-baked) at approximately 100° C. In this case, the bump resist 6 is formed to be slightly thinner than the resist pattern 4.

Figure 2E:
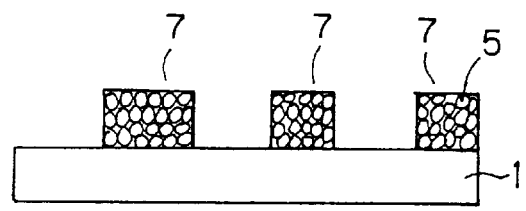
FIG. 2E is a process chart showing a removing step of the resist and the bump resist in the production method.

Continuously, by developing the resist pattern 4 using the predetermined developing liquid, the positive type resist pattern 4 is removed as shown in FIG. 2E, and the bump resist 6 formed on the positive type resist pattern 4 is also removed by this removal. As a result, the bump resist pattern 7 is formed.

Figure 2F:
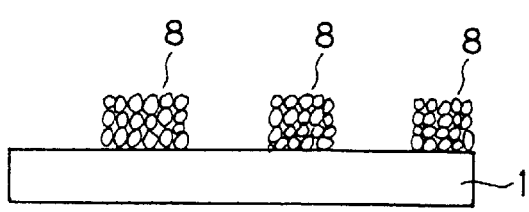
FIG. 2F is a process chart showing the removing step of the resist component in the bump resist in the production method.

Next, as shown in FIG. 2F, by heating at approximately 150° C. or more to remove the resist component in the resist pattern 7 mixed with the micro metallic powder 5, a micro bump (micro electrode) 8 consisting of the micro metallic powder 5 is formed.

In a manner as described above, even in the case the Liftoff method is adopted, it is possible to form the micro bump 8 by the photo etching technology using the resist containing the micro metallic powder 5. Further, patterning of very high accuracy is possible as compared to the conventional method wherein a solder bump or a gold bump is formed by the SBB (Stud Bump Bonding) method, MBB (Micro Bump Bonding) method, GBS (Gold Bump Soldering) method, or a plating method. Therefore, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board. Furthermore, the micro bump 8 can be formed with a sufficient thickness, and in a step where heating a lead under pressure or ultrasonic bonding for a lead under pressure is carried out, or in a step where solder fusing for electrically connecting the micro bump 8 and a lead, it is possible to securely bond the micro bump 8 to a lead carried out in a succeeding step.

Furthermore, by using the resist containing the micro metallic powder 5, it is possible to easily form the micro bump of minute width simply by forming the resist pattern of a desired width.

Furthermore, with the method for producing the micro bump of this embodiment, since the photo etching technology is used, it is possible to incorporate into a semiconductor process to produce the integrated circuit chip or the integrated circuit board. In this embodiment, instead of forming an electrode only after cutting into individual chips as in the case of the conventional bump forming method, it is possible to form the necessary number of micro bumps on a large wafer at one time. Therefore, it is possible to carry out a processing for a large quantity of the integrated circuit chip or the integrated circuit board in a short time.

Furthermore, according to this embodiment, since the micro bump is constituted of the micro metallic powder, without providing an application step of a sealing agent in the SBB (Stud Bump Bonding) method or a substrate washing step in the GBS method and a temporary crimping step of the ACF, by pressurizing/heat treatment or pressurizing/ultrasonic bonding, it is possible to electrically connect the electrode of the integrated circuit board or the electrode of the circuit board. That is, according to this embodiment, the man-hour in the chip mounting step can be reduced as compared with the conventional method.

[Third Embodiment]

Next, the third embodiment of the present invention will be explained based on FIGS. 3A–4F. This embodiment is an example wherein a step portion is provided by changing the thickness of the micro bump.

Figure 3A:
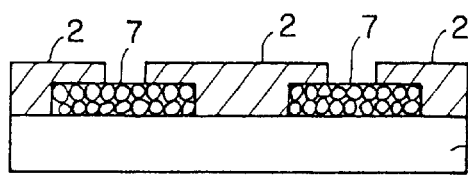
FIG. 3A is a process chart showing an application step of a resist in a production method of a micro bump in the third embodiment of the present invention.
Figure 3D:
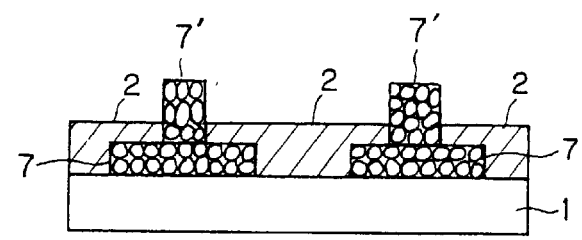
FIG. 3D is a process chart showing a removing step of the bump resist in the production method.

First, as shown in FIG. 1G, on the substrate 1 formed with the resist pattern 7 containing the micro metallic powder 5 according to the first embodiment, the negative type resist 2 is formed selectively as shown in FIG. 3A. In this case, the thickness of the resist 2 is formed to be greater than that of the resist pattern 7.

Figure 3B:
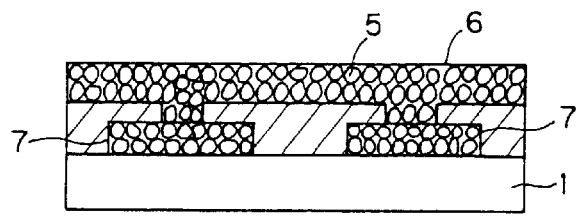
FIG. 3B is a process chart showing an application step of a bump resist mixed with micro metallic powder in the production method.

Next, as shown in FIG. 3B, the positive type resist 6 mixed with the micro metallic powder 5 is applied and heated (pre-baked) at approximately 100° C. The resist 6 is caused to be formed on the surface of the resist 2.

Figure 3E:
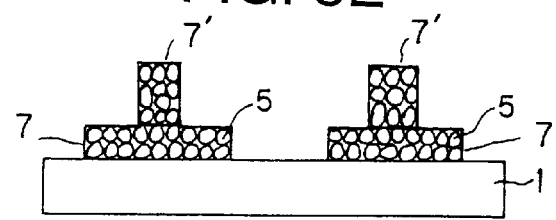
FIG. 3E is a process chart showing a removing step of the resist in the production method.
Figure 3C:
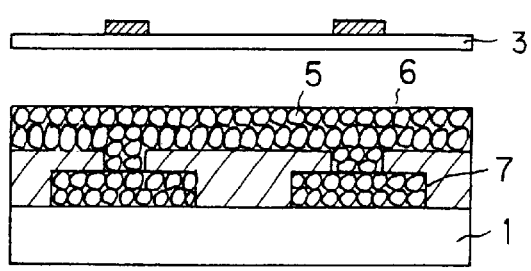
FIG. 3C is a process chart showing an exposure step using a photo mask of the bump resist in the production method.

Next, the photo mask 3 is used to carry out selective exposure as shown in FIG. 3C. As a result, the side chain of the bump resist 6 is cut and dissolved to the developing liquid.

Next, by developing using the predetermined developing solution, only the bump resist is developed and the bump resist 6 is developed and the bump resist pattern 7 is formed and a bump resist pattern 7' is formed thereon.

Furthermore, by removing the resist 2 with the organic type resist releasing solution, as shown in FIG. 3E, the resist pattern 7 and 7' mixed with two kinds of micro metallic powder of different thickness are integrally formed.

Figure 3F:
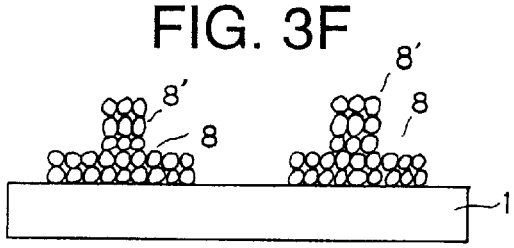
FIG. 3F is a process chart showing the removing step of the resist component in the bump resist in the production method.
Figure 4A:
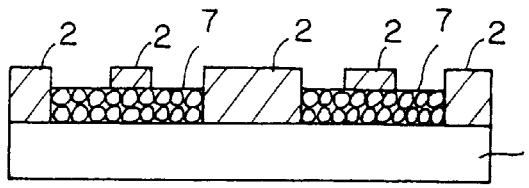
FIG. 4A is a process chart showing an application step of a resist a production method of a micro bump in the fourth embodiment of the present invention.
Figure 4B:
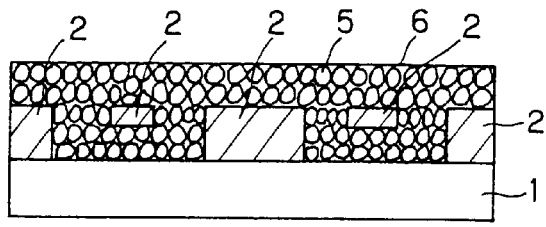
FIG. 4B is a process chart showing an application step of a bump resist mixed with micro metallic powder in the production method.
Figure 4C:
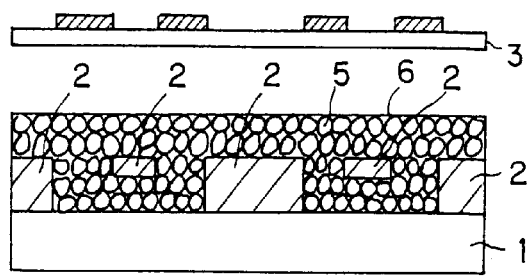
FIG. 4C is a process chart showing an exposure step using a photo mask of the bump resist in the production method.
Figure 4D:
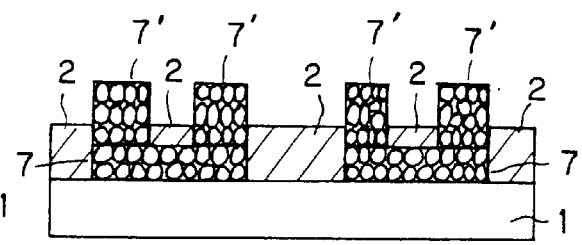
FIG. 4D is a process chart showing a removing step of the bump resist in the production method.
Figure 4E:
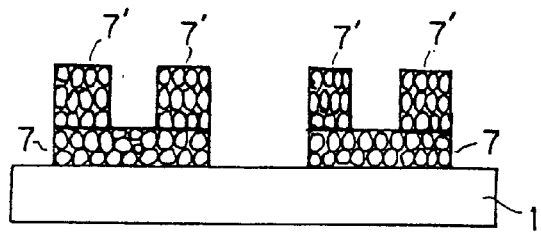
FIG. 4E is a process chart showing a removing step of the resist in the production method.
Figure 4F:
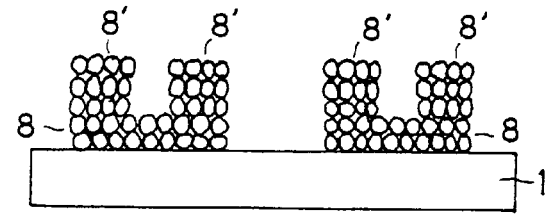
FIG. 4F is a process chart showing the removing step of the resist component of the bump resist in the production method.

Next, as shown in FIG. 3F, by heating at approximately 150° C. or more to remove the resist component in the resist patterns 7 and 7' mixed with the micro metallic powder 5, the micro bumps 8 and 8' in the convex form consisting of the micro metallic powder 5 is formed. Furthermore, this embodiment employs the substrate 1 formed with the resist pattern 7 containing the micro metallic powder 5 according to the first embodiment shown in FIG. 1G, however, this embodiment can employ the substrate 1 formed with the resist pattern 7 containing the micro metallic powder 5 according to the second embodiment as shown in FIG. 2E.

In a manner as described above, according to this embodiment, it is possible not only to have the same effect as the first embodiment or the second embodiment, but also to form a micro bump of greater thickness. Furthermore, even if the micro bump is of a form having a step, it can be easily produced.

Furthermore, as shown in FIG. 4A to FIG. 4F, a micro bump of different thickness has a step, and it is possible to form the micro bump 8 in the concave form. Furthermore, in each step shown in FIG. 4A to FIG. 4F, the form of the resist 2 and the resist pattern 7 is different, but the method is the same as that shown in FIG. 3A to FIG. 3F.

Namely, according to this embodiment, it is possible not only to increase the thickness of the micro bump further but also to set the form of the micro bump freely.

[Fourth Embodiment]

Next, the fourth embodiment of the present invention will be explained based on FIG. 5. This embodiment is an example wherein the micro bump is provided on a pad.

Figure 5:
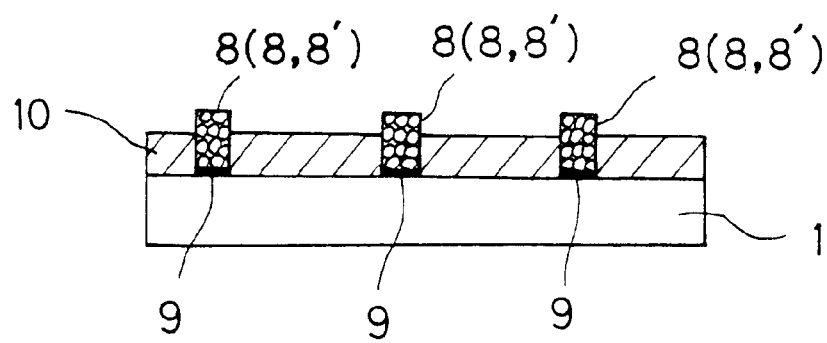
FIG. 5 is a diagram showing the constitution of an electrode portion including the micro bump in the fourth embodiment of the present invention.

FIG. 5 shows an embodiment wherein the micro bump 8 formed according to the first embodiment or the second embodiment, or the micro bumps 8 and 8' formed according to the third embodiment, are formed on the pad 9 of the substrate 1.

In this embodiment, on the electrode portion of the substrate 1, the pad 9 consisting of aluminum and the like is formed. On the entire surface excluding the pad 9 of the substrate 1, a protective film 10 consisting of polyamide or SiO$_2$ and the like. Furthermore, on the pad 9, the micro bump 8 constituted by the production method explained in the first embodiment or the second embodiment, or the micro bumps 8, 8' constituted by the production method explained in the third embodiment, are formed. To the micro bump 8 constituted by the production method explained in this first embodiment or the second embodiment, or the micro bumps 8, 8' constituted by the production method explained in the third embodiment, a lead is connected as described above, and the electrode portion of the substrate is directly connected in a device and the like directly connected with the substrate such as COF (Chip On Flexible-Board).

Furthermore, the micro bump 8 constituted by the production method explained in the first embodiment or the second embodiment, or the micro bumps 8, 8' constituted by the production method explained in the third embodiment shown in FIG. 5, are formed after or before the protective film 10 is formed.

As respectively explained in the above, according to the present invention, since the micro bump is formed by the photo etching technology using the resist containing the micro metallic powder, as compared the conventional method wherein a solder bump or a gold bump is formed by the SBB (Stud Bump Bonding) method, MBB (Micro Bump Bonding) method, GBS (Gold Bump Soldering) method, or a plating method, patterning of very high accuracy is possible. Further, even in the case where the number of pins of the integrated circuit chip or the integrated circuit board is increased, it is possible to easily connect the integrated circuit chip and the integrated circuit board, or the integrated circuit board and the circuit board, or the integrated circuit chip and the circuit board.

Furthermore, since the resist containing the micro metallic powder is used, it is possible to easily form the micro bump of minute width simply by forming the resist pattern of a desired width.

Furthermore, with the production method of the micro bump of this embodiment, since the photo etching technology is used, it is possible to incorporate into a semiconductor process to produce the integrated circuit chip or the integrated circuit board. In this embodiment, instead of forming an electrode only after cutting into individual chips as in the case of the conventional bump forming method, it is possible to form the necessary number of micro bumps on a large wafer at one time. Therefore, it is possible to carry out a processing for a large quantity of the integrated circuit chip or the integrated circuit board in a short time.

Furthermore, according to this embodiment, since the micro bump is constituted of the micro metallic powder, without providing an application step of a sealing agent in the SBB (Stud Bump Bonding) method or the GBS method, or a substrate washing step in the ACF (Anisotropic Conductive Film) method and a temporary crimping step of the ACF, by pressurizing/heat treatment, or pressurizing/ultrasonic bonding, it is possible to electrically connect the micro bump to the electrode of the integrated circuit board or the electrode of the circuit board. That is, according to this embodiment, the man-hour in the chip mounting step can be reduced as compared to the conventional method.

Furthermore, it is possible to set the form of the micro bump freely.

The invention may be embodied in other specific forms without departing from the spirit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefore intended to be embraces therein.

The entire disclosures of Japanese Patent Application No. 2000-381803 filed on Dec. 15, 2000 including the specification, claims, diagrams and summary is incorporated herein by reference in its entirety.

What is claimed is:

1. A method for producing a micro bump comprising:
   a step of forming a resist of a predetermined pattern on a substrate;
   a step of forming a bump resist mixed with macro metallic powder so that a first portion of the bump resist mixed with micro metallic powder is formed on the resist and a second portion of the bump resist mixed with metallic powder is formed on the substrate on which the resist is formed;
   a step of removing the resist after removing only the first portion of the bump resist mixed with micro metallic powder; and
   a step of removing a resist component in the second portion of the bump resist mixed with micro metallic powder, thereby forming a micro bump comprising the micro metallic powder on the substrate.

2. The method for producing the micro bump according to claim 1, wherein the micro metallic powder is joined to form the micro bump.

3. The method for producing the micro bump according to claim 1, further comprising:
   a step of electrically connecting the micro bump and a lead to the micro bump by bonding the lead with pressurized heat treatment or pressurized ultrasonic bonding.

4. A method for producing a micro bump comprising:
   a step of forming a resist of a predetermined pattern on the substrate;
   a step of forming a bump resist mixed with micro metallic powder so that a first portion of the bump resist mixed with micro metallic powder is formed on the resist and a second portion of the bump resist mixed with micro metallic powder is formed on the substrate on which the resist is formed, and so that the width of the second portion of the bump resist mixed with micro metallic powder in a direction perpendicular to the substrate is made thicker than that of the resist;
   a step of removing the resist; and
   a step of removing a resist component in the second portion of the bump resist mixed with micro metallic powder, thereby forming a micro bump comprising the micro metallic powder on the substrate.

5. A method for producing a micro bump comprising:
   a step of forming a resist of a predetermined pattern on the substrate;

a step of forming a bump resist mixed with the micro metallic powder so that a first portion of the bump resist mixed with micro metallic powder is formed on the resist and a second portion of the bump resist mixed with the micro metallic powder is formed on the substrate on which the resist is formed;

a step of removing the resist and the first portion of the a bump resist mixed with micro metallic powder formed on the resist; and a step of removing a resist component in the second portion of the bump resist mixed with the micro metallic powder, thereby forming a micro bump comprising the micro metallic powder on the substrate.

6. A method for producing a micro bump comprising:

a step of fanning a resist of a predetermined pattern on a substrate;

a step of forming a bump resist mixed with micro metallic powder on both of the resist and the substrate on which the resist is formed;

a step of removing the resist after removing the bump resist only on the resist;

a step of removing a resist component in the bump resist, thereby forming the micro bump comprising the metallic powder on the substrate;

a step of selectively forming a resist on the substrate on which the micro bump is formed so as to cover at least a part of the micro bump;

a step of forming a bump resist mixed with the micro metallic powder on the substrate;

a step or removing a bump resist formed on the resist out of the bump resist;

a step of removing the resist; and a step of removing time resist component in the bump resist, thereby forming the micro bump comprising the micro metallic powder on the substrate.

* * * * *

UNITED STATES PATENT AND TRADEMARK OFFICE
CERTIFICATE OF CORRECTION

PATENT NO. : 6,763,585 B2  Page 1 of 1
DATED : July 20, 2004
INVENTOR(S) : Suzuki It is certified that error appears in the above-identified patent and that said Letters Patent is hereby corrected as shown below:

Column 10,
Line 25, change "macro" to -- micro --.
Line 28, insert -- micro -- before "metallic".

Column 11,
Line 1, delete "the".
Line 7, delete "a" (second occurrence).
Line 15, change "fanning" to -- forming --.

Column 12,
Lines 4-5, insert -- micro -- before "metallic".
Line 12, change "or" to -- of --.
Line 15 change "time" to -- the --.

Signed and Sealed this

Twenty-sixth Day of October, 2004

JON W. DUDAS
*Director of the United States Patent and Trademark Office*